(12) United States Patent
Sato

(10) Patent No.: US 11,899,054 B2
(45) Date of Patent: Feb. 13, 2024

(54) CONNECTING DEVICE FOR INSPECTION

(71) Applicant: Kabushiki Kaisha Nihon Micronics, Tokyo (JP)

(72) Inventor: Minoru Sato, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 276 days.

(21) Appl. No.: 17/604,319

(22) PCT Filed: Apr. 3, 2020

(86) PCT No.: PCT/JP2020/015332
§ 371 (c)(1),
(2) Date: Oct. 15, 2021

(87) PCT Pub. No.: WO2020/213435
PCT Pub. Date: Oct. 22, 2020

(65) Prior Publication Data
US 2022/0214391 A1     Jul. 7, 2022

(30) Foreign Application Priority Data

Apr. 16, 2019   (JP) .................................. 2019-077724

(51) Int. Cl.
*G01R 31/26*     (2020.01)
*G01R 1/073*     (2006.01)

(52) U.S. Cl.
CPC ......... *G01R 31/26* (2013.01); *G01R 1/07342* (2013.01)

(58) Field of Classification Search
CPC ........................... G01R 31/26; G01R 1/07342; G01R 1/07378; G01R 1/071; G01R 1/0466;
(Continued)

(56) References Cited

U.S. PATENT DOCUMENTS 4,603,293 A * 7/1986 Mourou ................. G01R 1/071
324/76.36
5,272,434 A * 12/1993 Meyrueix ............ G01R 31/308
324/73.1
(Continued)

FOREIGN PATENT DOCUMENTS

JP         H07201945 A     8/1995
JP         2018081948 A    5/2018
(Continued)

*Primary Examiner* — Christopher P McAndrew
(74) *Attorney, Agent, or Firm* — Lorenz & Kopf, LLP

(57) ABSTRACT

A connecting device for inspection includes a probe head configured to hold electric contacts and optical contacts such that tip ends of the respective contacts are exposed on a lower surface of the probe head while proximal ends of the electric contacts are exposed on an upper surface of the probe head and the optical contacts are fixed to the probe head, and a transformer including connecting wires provided therein such that tip ends on one side of the connecting wires electrically connected to the proximal ends of the electric contacts exposed on the upper surface of the probe head are arranged in a lower surface of the transformer while the optical contacts slidably penetrate the transformer. A positional relationship between the tip end of the respective electric contacts and the tip end of the respective optical contacts on the lower surface of the probe head corresponds to a positional relationship between an electrical signal terminal and an optical signal terminal of a semiconductor device. The optical contacts continuously penetrate the probe head and the transformer.

10 Claims, 11 Drawing Sheets

(58) Field of Classification Search
CPC ............ G01R 1/06705; G01R 1/06733; G01R 1/07314; G01R 31/2863
USPC ........................................................ 324/501
See application file for complete search history.

(56) References Cited

U.S. PATENT DOCUMENTS

| | | | | |
|---|---|---|---|---|
| 5,274,325 | A * | 12/1993 | Shinagawa | G01R 31/311 324/96 |
| 5,459,394 | A * | 10/1995 | De Kort | G01R 1/071 324/96 |
| 5,508,805 | A * | 4/1996 | Muranishi | G01Q 60/22 356/482 |
| 6,462,814 | B1 * | 10/2002 | Lo | G01R 31/311 356/237.5 |
| 6,657,446 | B1 | 12/2003 | Goruganthu et al. | |
| 7,480,051 | B2 * | 1/2009 | Frank | G01R 31/311 356/399 |
| 2006/0244470 | A1 | 11/2006 | Shinde et al. | |

FOREIGN PATENT DOCUMENTS

| | | |
|---|---|---|
| KR | 101823142 B1 | 1/2018 |
| KR | 20180037509 A | 4/2018 |

\* cited by examiner (a)

(b)

(c)

(d)

(a)

(b)

(a)

(d)

(b)

(e)

(c)

CONNECTING DEVICE FOR INSPECTION

TECHNICAL FIELD

The present invention relates to a connecting device for inspection used for inspecting the characteristics of an inspection object.

BACKGROUND ART

Semiconductor devices to which electrical signals and optical signals are transmitted (referred to below as "optoelectronic devices") are formed on silicon substrates or the like by use of silicon photonics.

To inspect the characteristics of an optoelectronic device in a wafer state, it is effective to connect the optoelectronic device and an inspecting device by use of a connecting device for inspection including electric contacts that transfer electrical signals and optical contacts that transfer optical signals (refers to Patent Literature 1 and Patent Literature 2). For example, probes formed of conductive material are used as the electric contacts for connecting the optoelectronic device and the inspecting device, and optical fibers are used as the optical contacts for connecting the optoelectronic device and the inspecting device.

CITATION LIST

Patent Literature

Patent Literature 1: Japanese Unexamined Patent Application Publication No. H07-201945
Patent Literature 2: Japanese Unexamined Patent Application Publication No. 2018-81948

SUMMARY OF THE INVENTION

Technical Problem

The connecting device for inspection including units provided with the electric contacts and units provided with the optical contacts formed independently of each other is typically used for inspecting the optoelectronic device. The positioning between the optoelectronic device and the connecting device for inspection requires a certain period of time to align the optoelectronic device with the respective units independently of each other. In addition, the connecting device for inspection having the configuration described above has a problem of executing a test (a multi-test) that performs an electrical measurement using electrical signals and an optical measurement using optical signals simultaneously.

In response to this issue, the present invention provides a connecting device for inspection having a configuration capable of facilitating an alignment with an optoelectronic device and executing an electrical measurement and an optical measurement simultaneously.

Solution to Problem

An aspect of the present invention provides a connecting device for inspection including a probe head configured to hold an electric contact and an optical contact such that tip ends of the respective contacts are exposed on a lower surface of the probe head while a proximal end of the electric contact is exposed on an upper surface of the probe head and the optical contact is fixed to the probe head, and a transformer including a connecting wire provided therein such that a tip end on one side of the connecting wire electrically connected to the proximal end of the electric contact exposed on the upper surface of the probe head is arranged in a lower surface of the transformer while the optical contact slidably penetrates the transformer. A positional relationship between the tip end of the electric contact and the tip end of the optical contact on the lower surface of the probe head corresponds to a positional relationship between an electrical signal terminal and an optical signal terminal of a semiconductor device, and the optical contact continuously penetrates the probe head and the transformer.

Advantageous Effects of the Invention

The present invention can provide the connecting device for inspection with the configuration capable of facilitating the alignment with the optoelectronic device and executing the electrical measurement and the optical measurement simultaneously.

DESCRIPTION OF EMBODIMENTS

Figure 1:
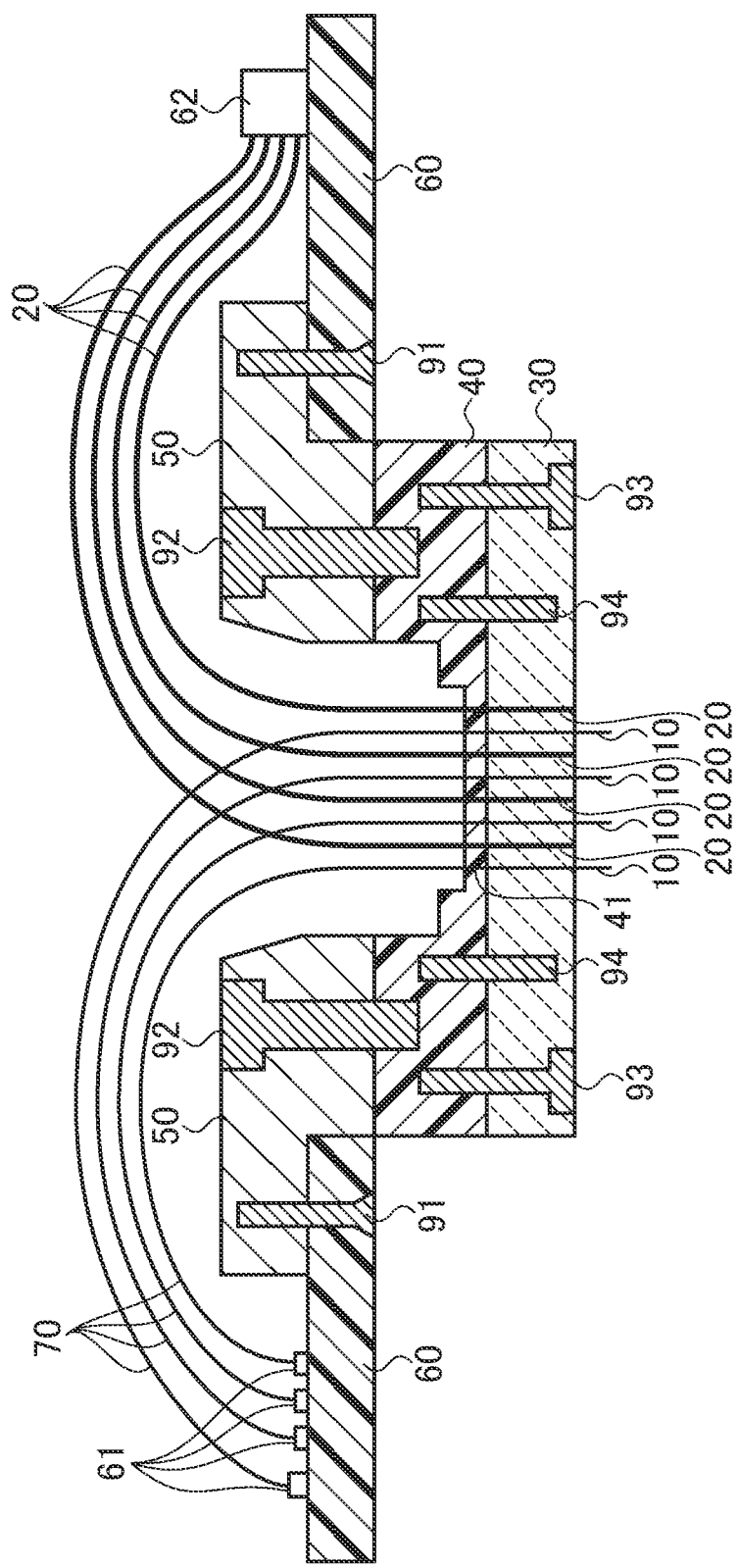
FIG. 1 is a schematic view illustrating a structure of a connecting device for inspection according to an embodiment of the present invention.

Some embodiments of the present invention are described below with reference to the drawings. The same or similar elements illustrated in the drawings are denoted below by the same or similar reference numerals. It should be understood that the drawings are illustrated schematically, and the proportions of the thicknesses of the respective elements in the drawings are not drawn to scale. It should also be understood that the dimensional relationships or proportions between the respective drawings can differ from each other. The embodiments described below illustrate devices or methods for embodying the technical idea of the present invention, but the respective embodiments are not intended to be limited to the materials, shapes, structures, or arrangements of the constituent elements as described herein.

A connecting device for inspection according to an embodiment of the present invention illustrated in FIG. 1 is used for inspecting an optoelectronic device including an electrical signal terminal to which an electrical signal is transmitted and an optical signal terminal to which an optical signal is transmitted. The optoelectronic device as used herein can be presumed to be, but not necessarily, a semiconductor device such as a silicon photonic device and a vertical cavity surface emitting laser (VCSEL). The optoelectronic device as a target to be inspected, not illustrated in FIG. 1, has a configuration in which a surface provided with the optical signal terminal and the electrical signal terminal (also collectively referred to below as "signal terminals") is opposed to the connecting device for inspection.

The connecting device for inspection illustrated in FIG. 1 includes electric contacts 10, optical contacts 20, a probe head 30 holding the electric contacts 10 and the optical contacts 20 such that the respective tip ends are exposed on the lower surface of the probe head 30, and a transformer 40 arranged on the probe head 30. The tip ends of the electric contacts 10 extend downward from the lower surface of the probe head 30, while the proximal ends of the electric contacts 10 are exposed on the upper surface of the probe head 30. The optical contacts 20 extend upward from the upper surface of the probe head 30.

A relative positional relationship between the tip end of the respective electric contacts 10 and the tip end of the respective optical contacts 20 as viewed in a surface normal direction of the lower surface of the probe head 30 (referred to below as a "planar view") corresponds to a relative positional relationship between the electrical signal terminal and the optical signal terminal of the optoelectronic device as a target to be inspected. In particular, the respective electric contacts 10 and the respective optical contacts 20 are held by the probe head 30 with a predetermined positioning accuracy so as to be reliably connected to the respective signal terminals of the optoelectronic device as a target to be inspected during the inspection. The phrase "reliably connected" as used herein refers to a state in which the respective electric contacts 10 and the respective optical contacts 20 are connected to the signal terminals of the optoelectronic device so as to ensure a predetermined measurement accuracy.

The tip end of the respective electric contacts 10 is electrically connected to the electrical signal terminal of the optoelectronic device as a target to be inspected. The tip end of the respective optical contacts 20 is optically connected to the optical signal terminal of the optoelectronic device as a target to be inspected. The optical connection leads the optical signal to be transmitted between the optical signal terminal of the optoelectronic device and the respective optical contacts 20. The optical contacts 20 are fixed to the probe head 30.

The transformer 40 is equipped therein with connecting wires 41. The tip ends on one side of the connecting wires 41 arranged in the lower surface of the transformer 40 are electrically connected to the proximal ends of the electric contacts 10 exposed on the upper surface of the probe head 30. The other tip ends of the connecting wires 41 are arranged in the upper surface of the transformer 40. The optical contacts 20 slidably penetrate the transformer 40. The optical contacts 20 continuously penetrate the probe head 30 and the transformer 40.

The connecting device for inspection illustrated in FIG. 1 further includes distributing wires 70 coupled with the other tip ends of the connecting wires 41 arranged inside the transformer 40, and a main substrate 60 provided thereon with electric terminals 61 electrically connected to the connecting wires 41 via the distributing wires 70. The distributing wire 70 are connected to the electric terminals 61 by soldering, for example. The main substrate 60 is also provided thereon with an optical terminal 62 coupled with the proximal ends of the optical contacts 20.

The main substrate 60 is provided with an electric circuit (not illustrated) electrically connected to the distributing wires 70 via the electric terminals 61. A preferable example of the main substrate 60 to be used is a printed substrate (a PCB). An inspecting device (not illustrated) is electrically connected to the electrical signal terminal of the optoelectronic device as a target to be inspected via the main substrate 60.

The inspecting device and the optical contacts 20 are connected to each other via the optical terminal 62 provided on the main substrate 60. For example, all of the optical contacts 20 may be connected to the inspecting device collectively at a single position of the main substrate 60 by use of an optical connector used as the optical terminal 62. Alternatively, a plurality of optical terminals 62 connected to the tip ends of the optical contacts 20 may be provided on the main surface of the main substrate 60 so as to connect the inspecting device with the respective optical contacts 20 independently of each other. The optical signals in this case may be input to the inspecting device after being converted to the electrical signals, or may be input directly to the inspecting device, which depends on the specifications of the inspecting device. For example, the optical contacts 20 and the inspecting device may be connected to each other via a photoelectric converting unit mounted on the main substrate 60 so as to use the input/output signals of the inspecting device as the electrical signals.

The optical signal terminal and the optical contact 20 are typically optically connected to each other in a state of being adjacent to each other but separately from each other. The connecting device for inspection illustrated in FIG. 1 enables the optical contacts 20 and the electric contacts 10 to be connected to the optoelectronic device simultaneously during the inspection of the optoelectronic device.

Upon the inspection of the optoelectronic device, the tip end of the electric contact 10 is electrically connected to the electrical signal terminal of the optoelectronic device, and the tip end of the optical contact 20 is optically connected to the optical signal terminal of the optoelectronic device. The electrical signal is then input to the optoelectronic device from the tip end of the electric contact 10, and the optical signal output from the optoelectronic device is input to the tip end of the optical contact 20, for example, so that the optical signal is detected by the inspecting device. The connecting device for inspection thus functions as a probe card that connects the inspecting device to the optoelectronic device as a target to be inspected.

A preferable example of the optical contact 20 to be used is an optical fiber. For example, the optical signal enters, from the optical signal terminal of the optoelectronic device, the end surface of the optical fiber located adjacent to the optical signal terminal. The optical contact 20 is not limited to the optical fiber, and may be any optical member that includes an optical guide. The optical guide of the optical fiber and the like is preferably configured to have a refractive index substantially equal to that of the optoelectronic device. In the case of the application to a silicon photonic device, the optical contact 20 is formed of a material having a refractive index conforming to silicon.

A preferable example of the electric contact 10 to be used is a probe formed of a conductive material. The electric contact 10 may be any type of probe.

A stiffener 50 having higher strength than the main substrate 60 is fixed to the main substrate 60. The stiffener 50 is used as a supporting body to ensure mechanical strength of the connecting device for inspection so as to prevent the main substrate 60 from being bent and also fix the respective constituent members to the connecting device for inspection.

The stiffener 50 is fixed to the main substrate 60 with fixing bolts 91 in the connecting device for inspection illustrated in FIG. 1. The transformer 40 is fixed to the stiffener 50 with fixing bolts 92. The transformer 40 fixed to the main substrate 60 thus can be presumed to serve as an integrated substrate together with the main substrate 60. The probe head 30 is attached to the transformer 40 with supporting bolts 93.

Positioning pins 94 are used for aligning the lower surface of the probe head 30 in parallel with the main surface of the optoelectronic device and for adjusting an attachment angle of the probe head 30 with respect to the transformer 40, for example. The positioning pins 94 are also used for positioning the probe head 30 with the transformer 40 so as to align the positions in the horizontal direction between the tip ends of the distributing wires 70 arranged in the transformer 40 and the upper parts of the electric contacts 10.

As described above, the probe head 30 is attached to the main substrate 60 and the transformer 40 with the supporting bolts 93 and the positioning pins 94. This structure facilitates the removal and attachment of the probe head 30 with respect to the main substrate 60 and thus facilitates the maintenance of the probe head 30.

Figure 2:
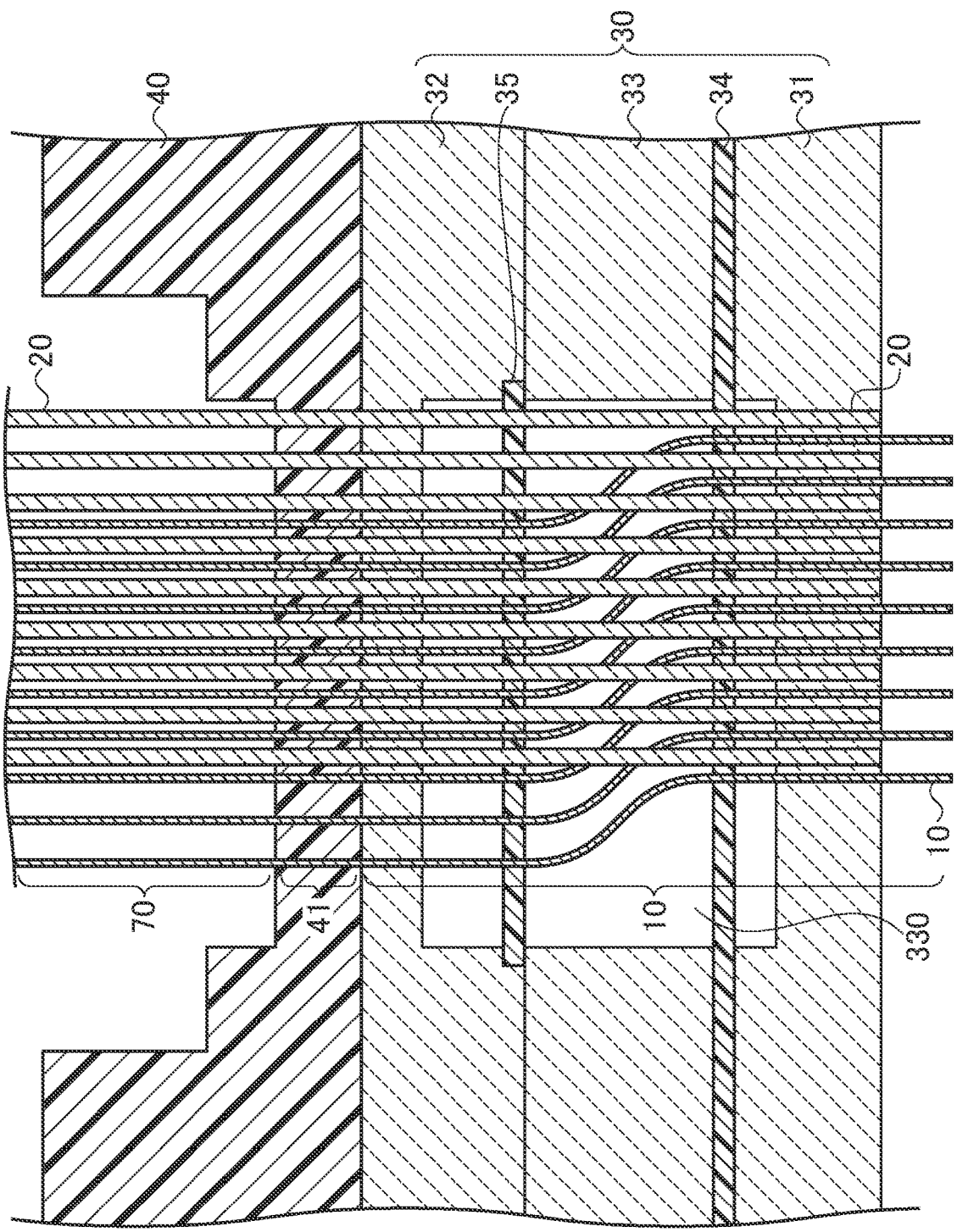
FIG. 2 is a schematic view illustrating a state in which a probe head and a transformer are attached to the connecting device for inspection according to the embodiment of the present invention.

As illustrated in FIG. 2, the probe head 30 includes a plurality of guide plates arranged separately from each other in the vertical direction between the upper surface and the lower surface through which the electric contacts 10 and the optical contacts 20 each penetrate. The probe head 30 illustrated in FIG. 2 includes a bottom guide plate 31 located adjacent to the tip ends of the electric contacts 10, and a top guide plate 32 located adjacent to the proximal ends of the electric contacts 10. A spacer 33 is interposed between the outer edge region of the bottom guide plate 31 and the outer edge region of the top guide plate 32 so as to provide a hollow region 330 between the top guide plate 32 and the bottom guide plate 31. The guide plates for supporting the electric contacts 10 and the optical contacts 20 need to have predetermined mechanical strength. In view of this, a ceramic plate is preferably used that has mechanical strength and is easily provided with penetration holes.

The probe head 30 further includes a first guide film 34 and a second guide film 35 (also collectively referred to below as "guide films") arranged between the bottom guide plate 31 and the top guide plate 32. The electric contacts 10 and the optical contacts 20 penetrate the guide films. The first guide film 34 is arranged adjacent to the bottom guide plate 31, and the second guide film 35 is arranged substantially in the middle between the bottom guide plate 31 and the top guide plate 32. The guide films to be used are films made of resin, for example.

The electric contacts 10 and the optical contacts 20 penetrate through guide holes provided in the guide plates and the guide films. As illustrated in FIG. 2, the position of the top guide plate 32 and the position of the bottom guide plate 31 through which the common electric contacts 10 penetrate are displaced from each other in the planar view (referred to below as an "offset arrangement").

The offset arrangement leads the respective electric contacts 10 to be bent by elastic deformation between the bottom guide plate 31 and the top guide plate 32 inside the hollow region 330. When each electric contact 10 comes into contact with the optoelectronic device, the electric contact 10 is further bent and buckled so as to be pressed against the optoelectronic device with a predetermined pressure. The offset arrangement thus can bring the electric contact 10 into contact with the optoelectronic device stably. The arrangement of the guide films in the hollow region 330 can prevent the respective electric contacts 10 in a bent state from coming into contact with each other.

Figure 3:
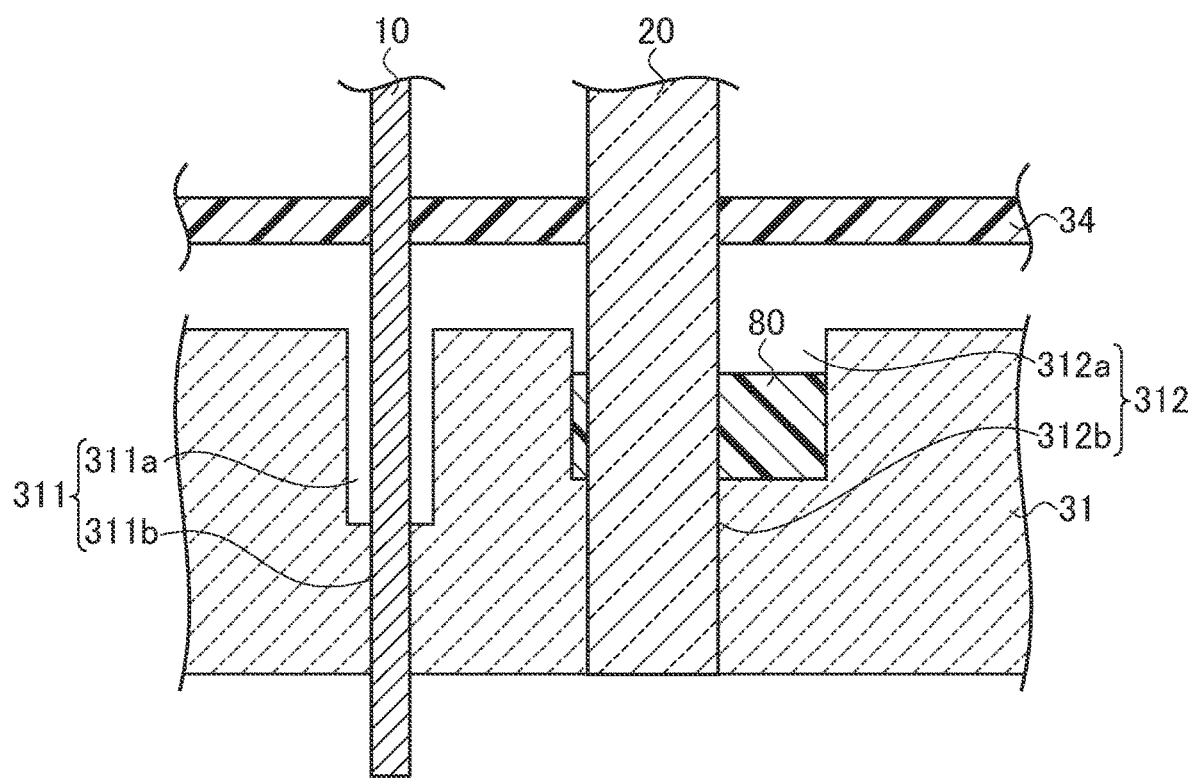
FIG. 3 is a schematic view illustrating a state in which an optical contact is fixed to the probe head in the connecting device for inspection according to the embodiment of the present invention.

In the connecting device for inspection according to the embodiment, the optical contacts 20 are fixed to the bottom guide plate 31 that is the lowest guide plate among the plural guide plates included in the probe head 30. For example, in the state in which the optical contacts 20 penetrate through the guide holes of the bottom guide plate 31, a resin 80 is injected to the gaps between the guide holes and the optical contacts 20, as illustrated in FIG. 3. The optical contacts 20 are fixed to the bottom guide plate 31 when the resin 80 is cured.

The bottom guide plate 31 illustrated in FIG. 3 is provided with a first guide hole 311 to which the electric contact 10 is inserted, and a second guide hole 312 to which the optical contact 20 is inserted.

The first guide hole 311 includes a large-diameter electric guide hole 311a having an inner diameter larger than a diameter of the electric contact 10 and a small-diameter electric guide hole 311b having an inner diameter substantially the same as the diameter of the electric contact 10, in which the respective electric guide holes communicate with each other in the extending direction of the first guide hole 311. The small-diameter electric guide hole 311b is located closer to the lower surface of the probe head 30 than the large-diameter electric guide hole 311a, and the tip end of the electric contact 10 is inserted to the small-diameter electric guide hole 311b.

The tip end of the electric contact 10 is inserted first to the large-diameter electric guide hole 311a so that the electric contact 10 is easily inserted to the first guide hole 311. The electric contact 10 is then inserted to the small-diameter electric guide hole 311b communicating with the large-diameter electric guide hole 311a. Setting the inner diameter of the small-diameter electric guide hole 311b to be substantially the same as the diameter of the electric contact 10 enables the accurate positioning of the tip end of the electric contact 10. The use of the first guide hole 311 including the large-diameter electric guide hole 311a and the small-diameter electric guide hole 311b communicating with each other contributes to both facilitating the insertion of the electric contact 10 to the guide hole and achieving the accurate positioning of the tip end of the electric contact 10.

The second guide hole 312 includes a large-diameter electric guide hole 312a having an inner diameter larger than a diameter of the optical contact 20 and a small-diameter electric guide hole 312b having an inner diameter substantially the same as the diameter of the optical contact 20, in which the respective electric guide holes communicate with each other in the extending direction of the second guide hole 312. The small-diameter electric guide hole 312b is located closer to the lower surface of the probe head 30 than the large-diameter electric guide hole 311a, and the tip end of the optical contact 20 is inserted to the small-diameter electric guide hole 312b.

The tip end of optical contact 20 is inserted first to the large-diameter electric guide hole 312a so that the optical contact 20 is easily inserted to the second guide hole 312. The optical contact 20 is then inserted to the small-diameter electric guide hole 312b communicating with the large-diameter electric guide hole 312a. The tip end of the optical contact 20 is fixed to the inside of the small-diameter electric guide hole 312b with the resin 80. Setting the inner diameter of the small-diameter electric guide hole 312b to be substantially the same as the diameter of the optical contact 20 enables the accurate positioning of the tip end of the optical contact 20. The use of the second guide hole 312 including the large-diameter electric guide hole 312a and the small-diameter electric guide hole 312b communicating with each other contributes to both facilitating the insertion of the optical contact 20 to the guide hole and achieving the accurate positioning of the tip end of the optical contact 20.

As described above, the connecting device for inspection according to the embodiment can execute the positioning between the electric contacts 10 and the optical contacts 20 inside the same bottom guide plate 31, so as to have the advantage of achieving the accurate positioning of the respective tip ends of the electric contacts 10 and the optical contacts 20 quickly.

The connecting wires 41 may be part of the distributing wires 70. In particular, part of the distributing wires 70 is inserted to the penetration holes formed in the transformer 40, and the tip ends of the distributing wires 70 are exposed on the lower surface of the transformer 40. The tip ends of the distributing wires 70 and the proximal ends of the electric contacts 10 exposed on the upper surface of the probe head 30 are connected to each other during the attachment of the transformer 40 and the probe head 30. For example, resin may be inserted to gaps between the penetration holes formed in the transformer 40 and the distributing wires 70 and then cured so as to fix the distributing wires 70 to the transformer 40. This can fix the positions of the tip ends of the distributing wires 70.

Figure 4:
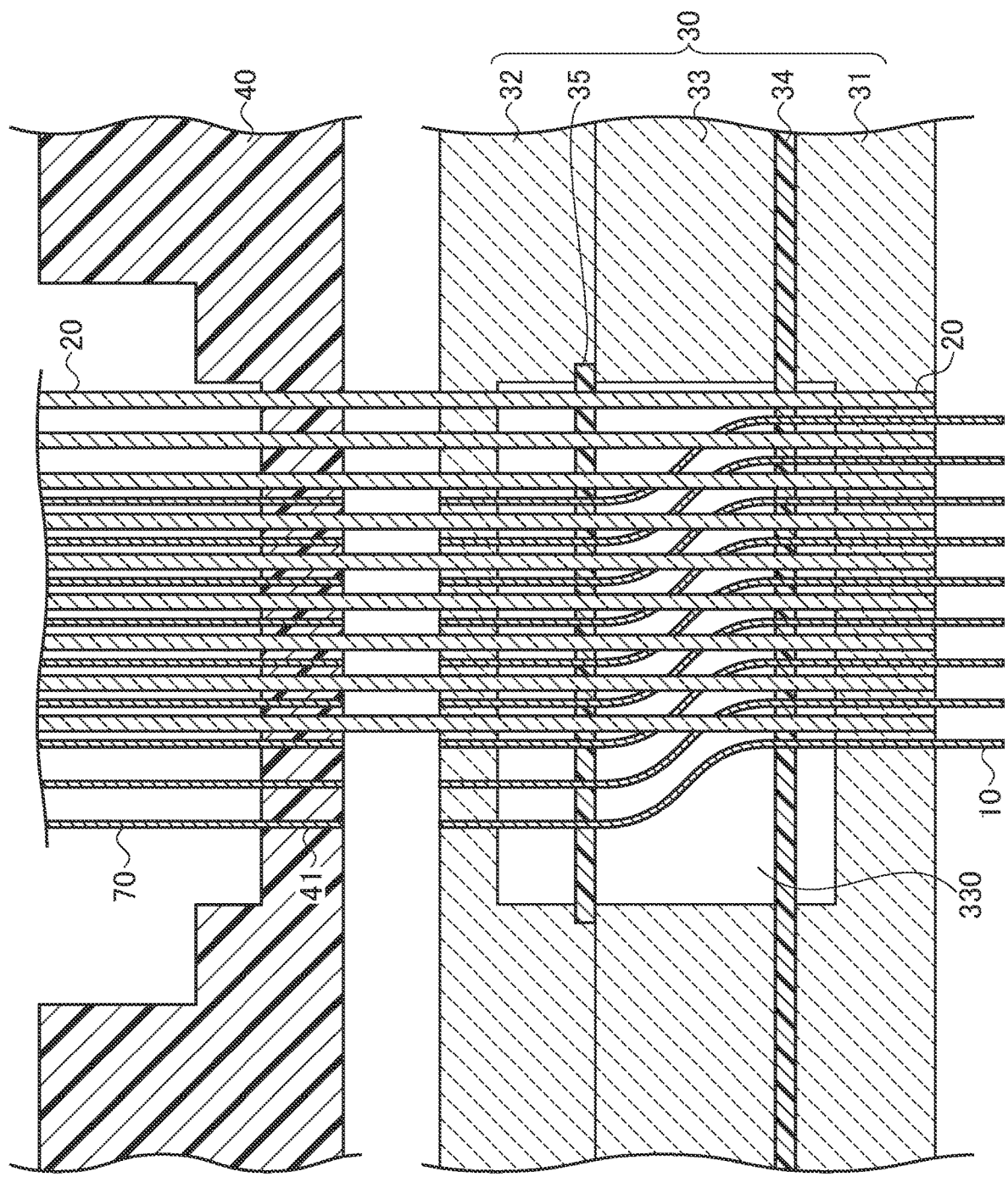
FIG. 4 is a schematic view illustrating a state in which the probe head and the transformer are separated from each other in the connecting device for inspection according to the embodiment of the present invention.

In the connecting device for inspection described above, the probe head 30 and the transformer 40 are detachably attached to each other. In particular, as illustrated in FIG. 4, the probe head 30 and the transformer 40 can be separated from each other in the state in which the electric contacts 10 and the optical contacts 20 are positioned. Since the optical contacts 20 are not fixed to the transformer 40, the optical contacts 20 slide inside the penetration holes formed in the transformer 40 as the probe head 30 is gradually separated from the transformer 40.

The detachable attachment of the probe head 30 and the transformer 40 can ensure the effects of facilitating the maintenance of the connecting device for inspection. For example, a repair or a replacement of the probe head 30 can be executed in the state in which the optical contacts 20 keep penetrating the transformer 40. This can reduce the time required for the maintenance. The replacement of the electric contacts 10 in the probe head 30 can be executed one by one. The replacement of the optical contacts 20 can be executed together with the bottom guide plate 31 to which the optical contacts 20 are fixed.

The proximal ends of the electric contacts 10 exposed on the upper surface of the probe head 30 are led to be electrically connected to the tip ends on one side of the connecting wires 41 arranged in the lower surface of the transformer 40 upon the attachment of the transformer 40 and the probe head 30.

Various kinds of shapes can be used for the tip end of the optical contact 20 opposed to the optoelectronic device. For example, when an optical fiber 21 including a core 211 and a clad 212 is used as the optical contact 20, the tip end of the optical fiber 21 can have various shapes, as illustrated in FIG. 5(a) to FIG. 5(d).

Figure 5:
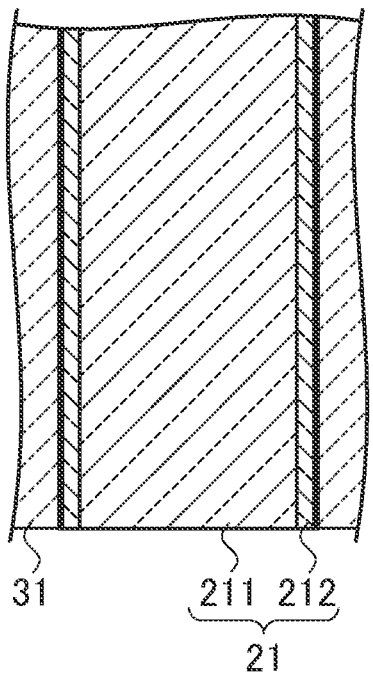
FIG. 5 is a schematic view illustrating an example of a tip end of the optical contact in the connecting device for inspection according to the embodiment of the present invention, FIG. 5(a) to FIG. 5(d) showing a variation in shape of the tip end of the optical contact.
Figure 5:
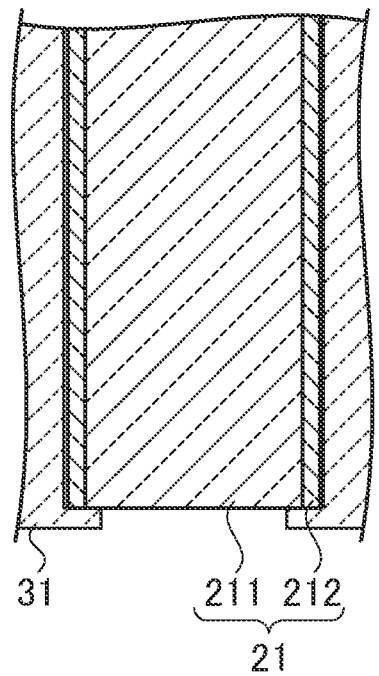
Figure 5:
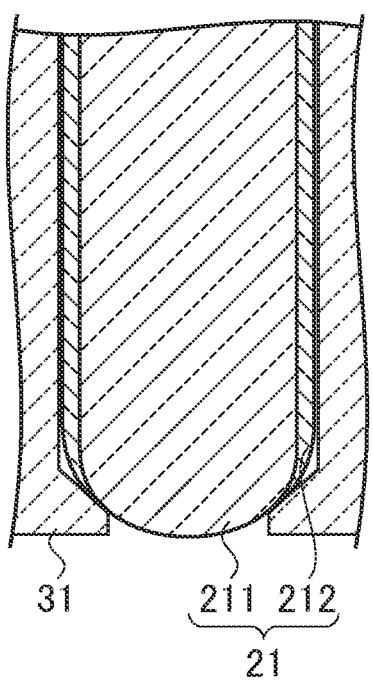
Figure 5:
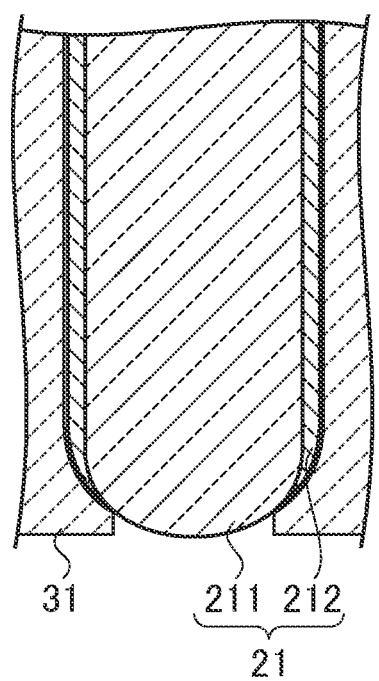

FIG. 5(a) illustrates a straight shape in which the end surface of the optical fiber 21 and the lower surface of the probe head 30 are located on the same plane. The straight shape enables the processing of the probe head 30 most easily.

FIG. 5(b) illustrates a flanged shape in which the opening of the guide hole formed on the lower surface of the probe head 30 has a smaller diameter than the end surface of the optical fiber 21. The flanged shape leads the tip end of the optical fiber 21 to come into contact with the flange of the guide hole, so as to stably keep the position of the end surface of the optical fiber 21.

FIG. 5(c) and FIG. 5(d) each illustrate a shape in which the end surface of the optical fiber 21 is curved. FIG. 5(c) illustrates a case in which the opening of the guide hole formed on the lower surface of the probe head 30 has a tapered shape, and FIG. 5(d) illustrates a case in which the opening of the guide hole formed on the lower surface of the probe head 30 has a spherical surface. The curved end surface of the optical fiber 21 facilitates the concentration of light emitted from the optoelectronic device on the optical fiber 21.

Figure 6:
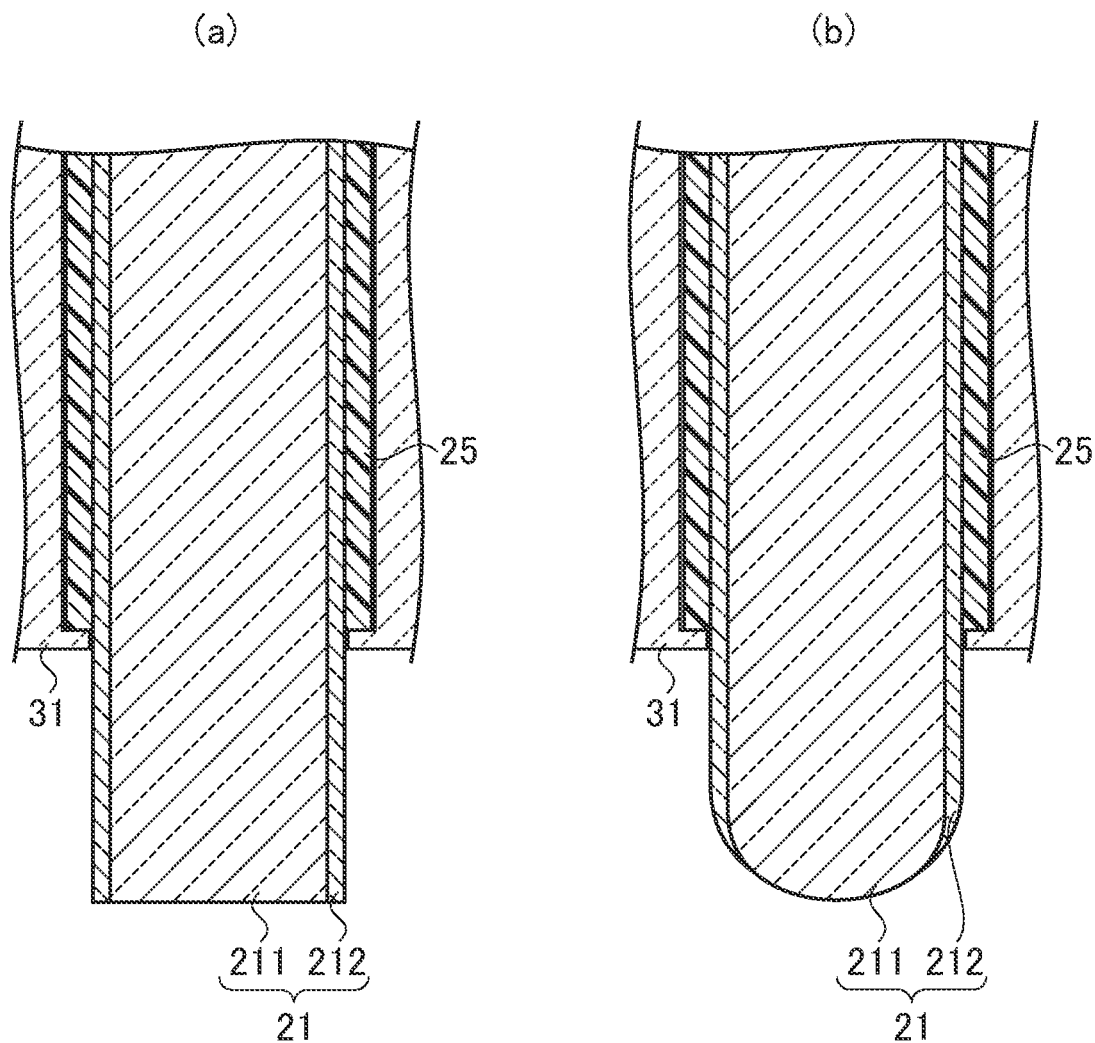
FIG. 6 is a schematic view illustrating another example of the tip end of the optical contact in the connecting device for inspection according to the embodiment of the present invention, FIG. 6(a) and FIG. 6(b) showing a variation in shape of the tip end of the optical contact.

As illustrated in FIG. 6(a) and FIG. 6(b), the tip end of the optical fiber covered with a coating film 25 may be set to be located below the lower surface of the probe head 30. FIG. 6(a) illustrates a case in which the guide hole through which the optical fiber 21 having a straight-shaped tip end penetrates has a flanged shape in which the lower part is narrowed. This shape leads the coating film 25 provided along the circumference of the optical fiber 21 to come into contact with the flange of the guide hole, so as to stably keep the position of the optical fiber 21. FIG. 6(b) illustrates a case in which the optical fiber 21 having a curved tip end is covered with the coating film 25. The coating film 25 in this case also comes into contact with the flange of the guide hole. The coating film 25 thus serves as a stopper so as to prevent the optical fiber 21 from coming off the guide hole. The coating film 25 to be used is a resin film, for example. The use of the coating film 25 as a stopper for stopping the optical fiber 21 in the probe head 30 as described above can eliminate the use of resin for fixing the optical fiber 21 to the probe head 30. The coating film 25 leads the optical fiber 21 to be tightly attached to the probe head 30.

Figure 7:
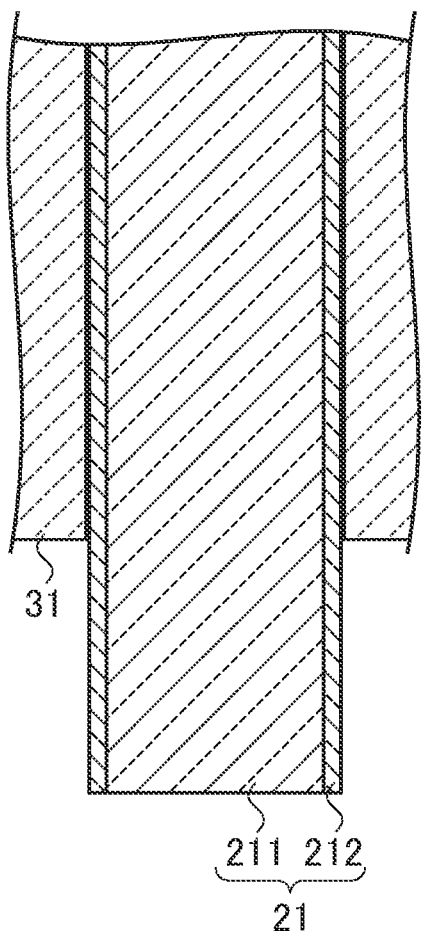
FIG. 7 is a schematic view illustrating still another example of the tip end of the optical contact in the connecting device for inspection according to the embodiment of the present invention, FIG. 7(a) and FIG. 7(b) showing a variation in shape of the tip end of the optical contact.
Figure 7:
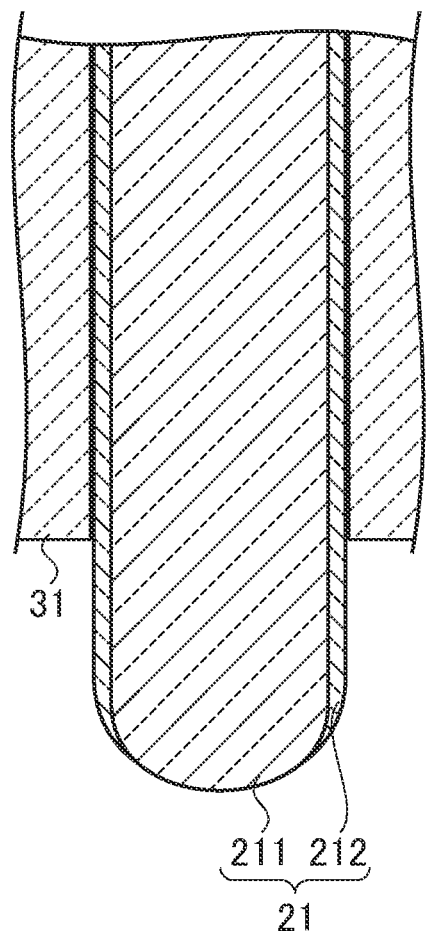

As illustrated in FIG. 7(a) and FIG. 7(b), the tip end of the optical fiber 21 not covered with the coating film 25 may be set to be located below the lower surface of the probe head 30. The optical fiber 21 not covered with the coating film 25 has a smaller outer diameter, contributing to a reduction in pitch, as compared with the optical fiber 21 covered with the coating film 25.

In the case in which the tip end of the optical fiber 21 does not protrude below the lower surface of the probe head 30, the probe head 30 has a probability of coming into contact with the optoelectronic device when the tip end of the optical fiber 21 is brought closer to the optoelectronic device. The tip end of the optical fiber 21 that protrudes below the probe head 30, as illustrated in FIG. 6(a) and FIG. 6(b) or FIG. 7(a) and FIG. 7(b), can be brought closer to the optoelectronic device that is still separated from the probe head 30.

The tip end of the optical fiber 21 may be provided with a lens. The fixing method by use of the resin 80 is selected as appropriate depending on the specifications of the tip end of the optical fiber 21. The lower surface of the probe head 30 can be subjected to grinding processing before the respective electric contacts 10 are inserted to the probe head 30 after the step of fixing the optical fibers 21 to the probe head 30.

Figure 8:
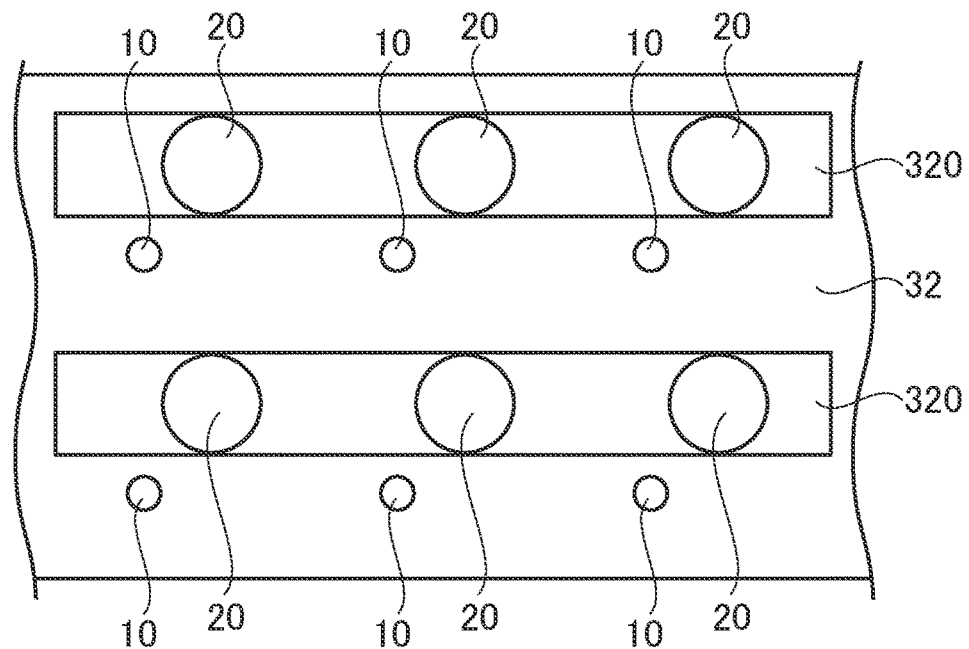
FIG. 8 is a schematic plan view illustrating a structure of a top guide plate of the probe head in the connecting device for inspection according to the embodiment of the present invention.

As illustrated in FIG. 8, the respective guide holes 320 provided in the top guide plate 32 through which the optical contacts 20 penetrate may be used in common with the plural optical contacts 20 adjacent to each other. FIG. 8 is a plan view illustrating the main surface of the top guide plate 32.

Figure 9:
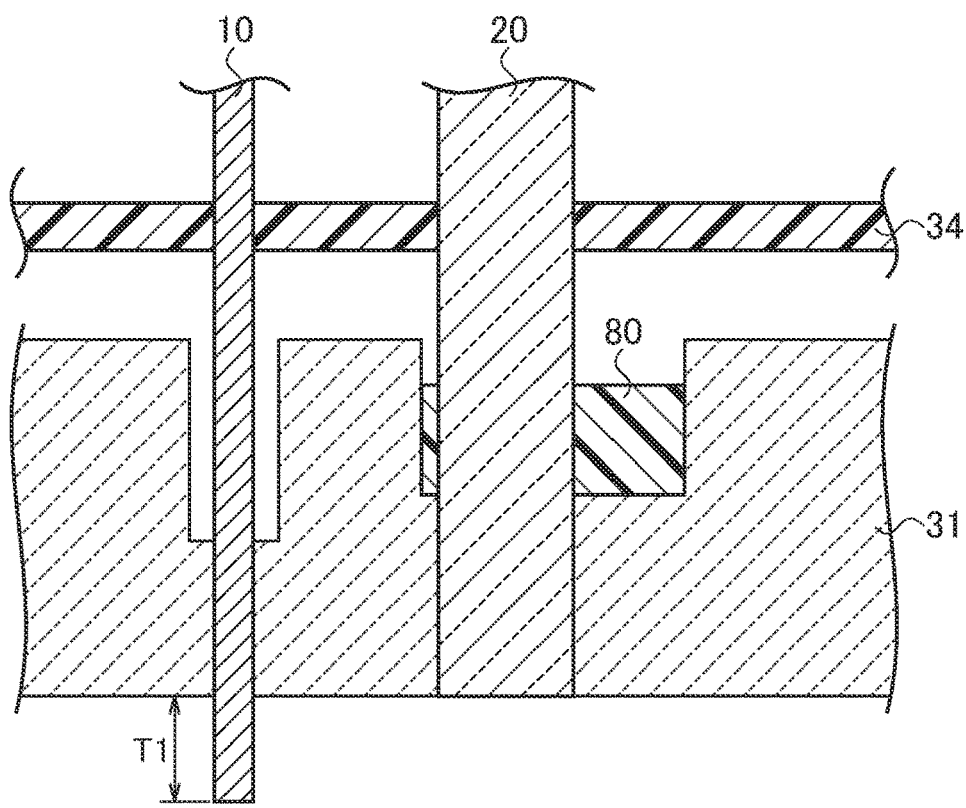
FIG. 9 is a schematic view for explaining an operation during inspection in the connecting device for inspection according to the embodiment of the present invention (part 1).

The connecting device for inspection according to the embodiment is used for inspecting the optoelectronic device as follows. The respective electric contacts 10 and the optoelectronic device are positioned with each other with the connecting device for inspection having a configuration in which the tip end of the electric contact 10 extends by a tip-end length T1 below the lower surface of the probe head 30, as illustrated in FIG. 9. The tip-end length T1 is about 200 µm, for example.

The positioning is executed such that a stage having a mount surface on which the optoelectronic device is mounted is moved in a direction parallel to the mount surface or is rotated about a central axis in a surface normal direction of the mount surface. This positioning may be executed while an alignment mark provided in the connecting device for inspection is captured by an imaging device such as a CCD camera mounted on the stage.

For example, when a captured image of the alignment mark provided in the connecting device for inspection is obtained by the imaging device mounted on the stage, the information on the relative position between the stage on which the optoelectronic device is mounted and the connecting device for inspection is acquired through image processing executed for the captured image. The position and the direction of the stage, for example, are adjusted in accordance with the information on the relative position so that the tip end of the electric contact 10 can be located at a position in contact with the electrical signal terminal of the optoelectronic device.

Figure 10:
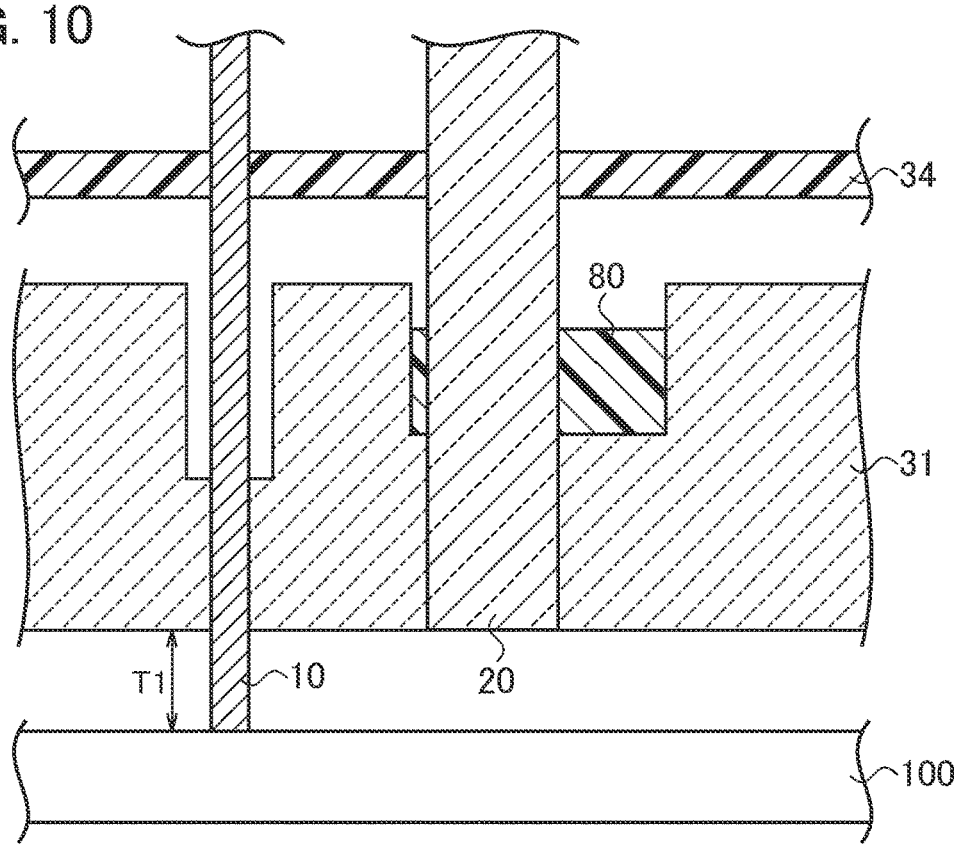
FIG. 10 is a schematic view for explaining the operation during inspection in the connecting device for inspection according to the embodiment of the present invention (part 2).

The tip end of the electric contact 10 is then brought into contact with the electrical signal terminal (not illustrated) of the optoelectronic device 100, as illustrated in FIG. 10, in a state in which the tip end of the electric contact 10 and the position of the electrical signal terminal of the optoelectronic device 100 conform to each other in the planar view. Since the positional relationship between the tip end of the electric contact 10 and the tip end of the optical contact 20 corresponds to the positional relationship between the electrical signal terminal and the optical signal terminal of the optoelectronic device 100, the optical contact 20 is also positioned so as to conform to the optical signal terminal of the optoelectronic device 100.

Figure 11:
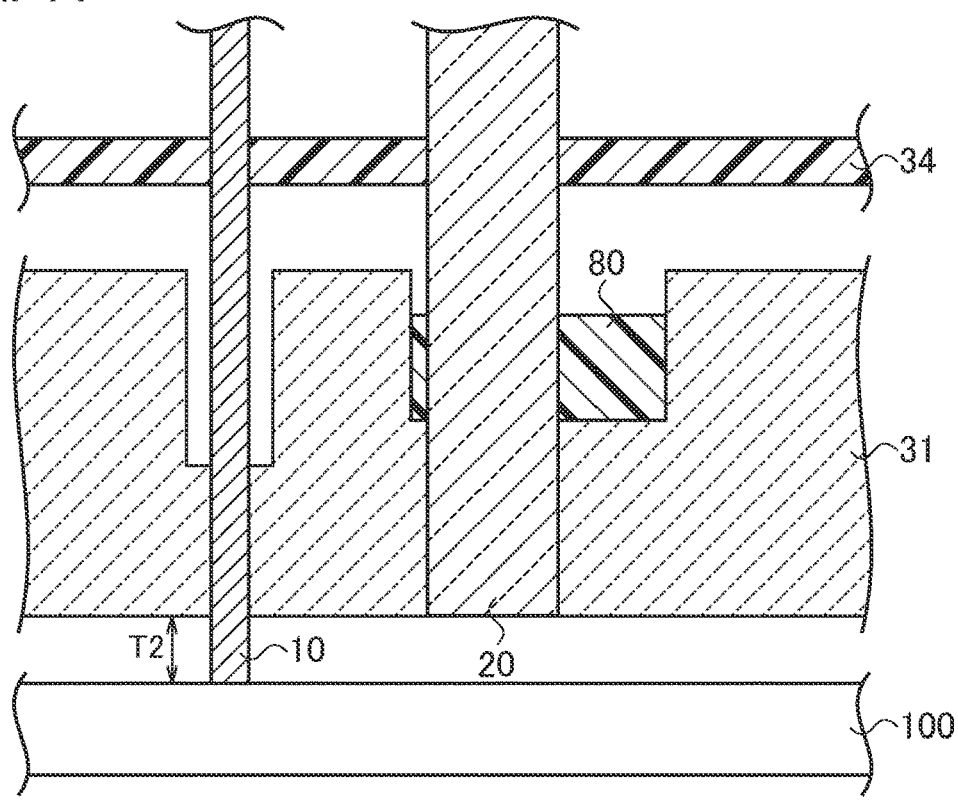
FIG. 11 is a schematic view for explaining the operation during inspection in the connecting device for inspection according to the embodiment of the present invention (part 3).

Next, as illustrated in FIG. 11, the optoelectronic device 100 and the connecting device for inspection are brought closer to each other so that the electric contact 10 is pressed at a predetermined pressure against the electrical signal terminal of the optoelectronic device 100. For example, overdrive is applied so as to press the tip end of the electric contact 10 against the optoelectronic device 100.

The optoelectronic device 100 and the connecting device for inspection are brought closer to each other such that a gap T2 between the tip end of the optical contact 20 and the optical signal terminal of the optoelectronic device 100 reaches a gap that allows the optical contact 20 and the optical signal terminal to be optically connected to each other. The gap between the tip end of the optical contact 20 and the optoelectronic device 100 can be regulated in a predetermined range depending on the setting of the tip-end length T1 of the electric contact 10 and the setting of the overdrive. For example, the gap T2 is about 100 µm when the tip-end length T1 of the electric contact 10 is set to 160 µm and the overdrive of 60 µm is applied.

In the connecting device for inspection illustrated in FIG. 1, the electric contacts 10 and the optical contacts 20 are each arranged in the probe head 30 with a predetermined positioning accuracy. As described above, the positioning of the electric contact 10 with the electrical signal terminal of the optoelectronic device 100 enables the simultaneous positioning of the optical contact 20 with the optical signal terminal of the optoelectronic device 100. This facilitates the alignment between the connecting device for inspection and the optoelectronic device 100. The simultaneous positioning with the predetermined positioning accuracy between the electric contact 10 and the electrical signal terminal of the optoelectronic device 100 and between the optical contact 20 and the optical signal terminal of the optoelectronic device 100 can execute the electrical measurement and the optical measurement for the optoelectronic device 100 simultaneously.

Figure 12:
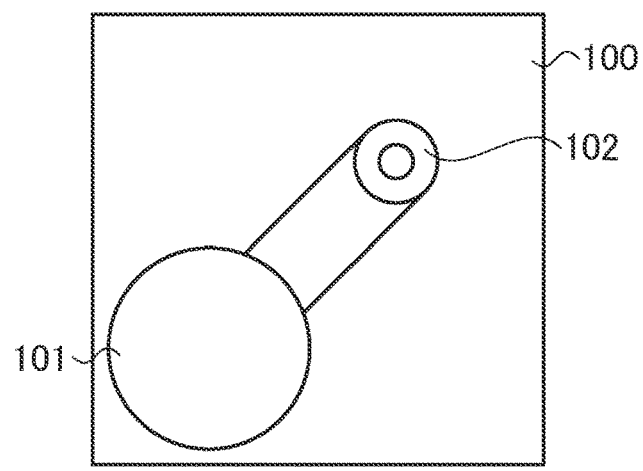
FIG. 12 is a plan view illustrating an example of a structure of an optoelectronic device as a target to be inspected.

The connecting device for inspection to be aligned with the optoelectronic device 100 provided with the electrical signal terminal 101 and the optical signal terminal 102 as illustrated in FIG. 12 is described below. FIG. 12 illustrates the optoelectronic device 100 with a VCSEL in which the electrical signal terminal 101 is a signal input terminal, and the optical signal terminal 102 is a light-emission surface.

Figure 13:
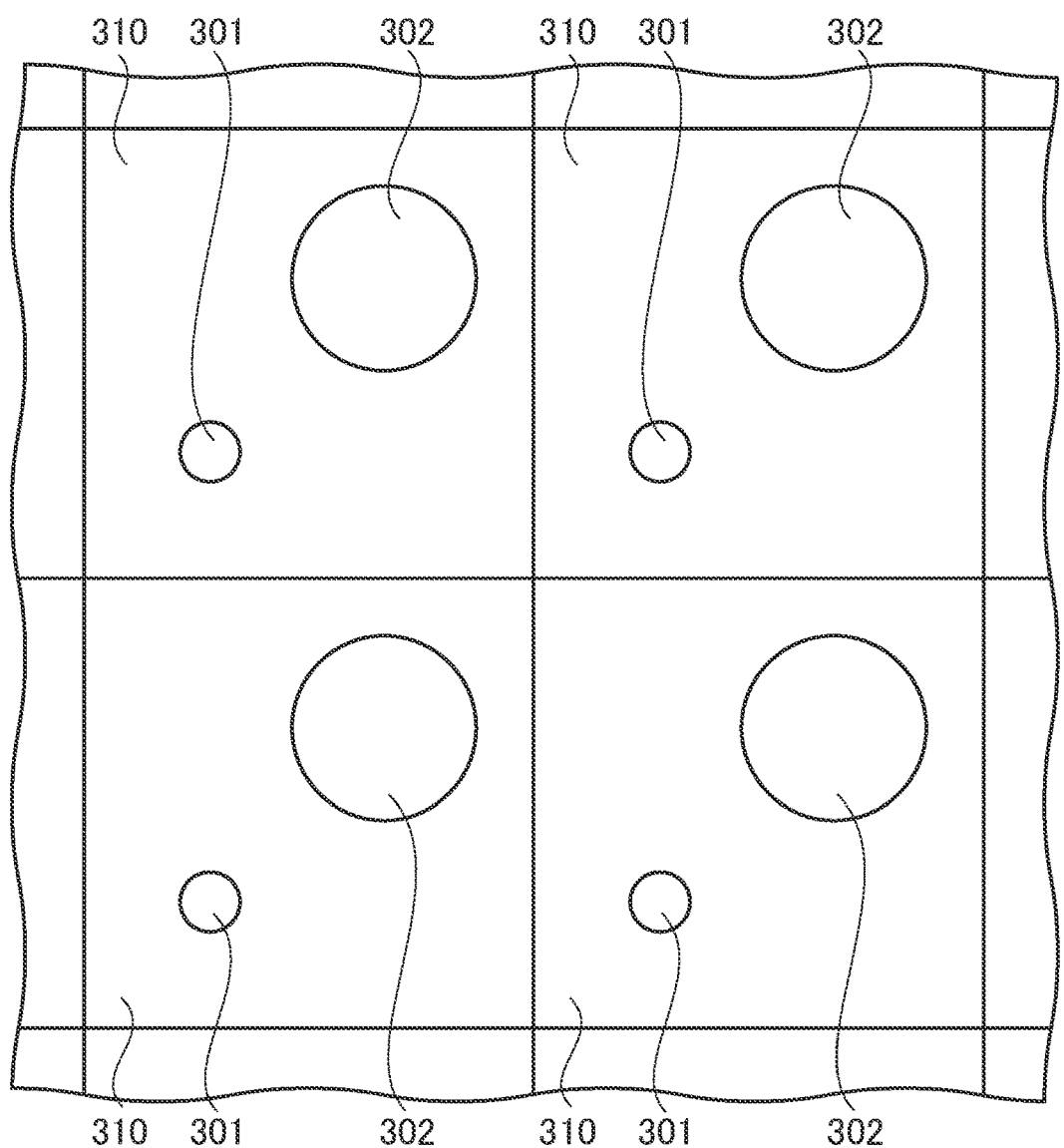
FIG. 13 is a plan view illustrating an example of positions of guide holes provided in a bottom guide plate of the probe head in the connecting device for inspection according to the embodiment of the present invention.

The plural optoelectronic devices 10 are arranged in a wafer. As illustrated in FIG. 13, the probe head 30 is prepared that includes a plurality of units 310 each arranged such that a guide hole 301 for electric contact and a guide hole 302 for optical contact respectively correspond to the position of the electrical signal terminal 101 and the position of the optical signal terminal 102. FIG. 13 is a plan view illustrating the bottom guide plate 31. The single unit 310 corresponds to the single optoelectronic device 100. The probe head 30 thus has a configuration in which the plural units 310 are each arranged such that the tip end of the electric contact 10 and the tip end of the optical contact 20 respectively correspond to the electrical signal terminal and the optical signal terminal of each optoelectronic device 100.

The electric contacts 10 and the optical contacts 20 are inserted to the guide holes provided in the guide plates and the guide films of the probe head 30. This fixes the positions of the respective tip ends of the electric contacts 10 and the optical contacts 20.

The plural optoelectronic devices 100 are typically arranged in a grid state in the wafer. The units 310 are thus typically positioned to correspond to the positions of the optoelectronic devices 100 arranged in the grid state. The positions of the units 310 may be varied depending on the arrangement of the optoelectronic devices 100 in the wafer. FIG. 14(a) to FIG. 14(e) illustrate a variation in the arrangement of the units 310.

Figure 14:
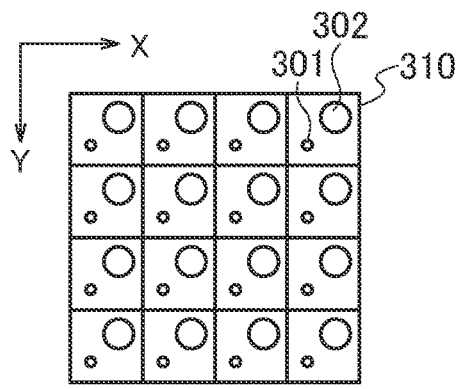
FIG. 14 is a plan view illustrating the bottom guide plate of the probe head in the connecting device for inspection according to the embodiment of the present invention, FIG. 14(a) to FIG. 14(e) showing a variation in arrangement of units composing the bottom guide plate.
Figure 14:
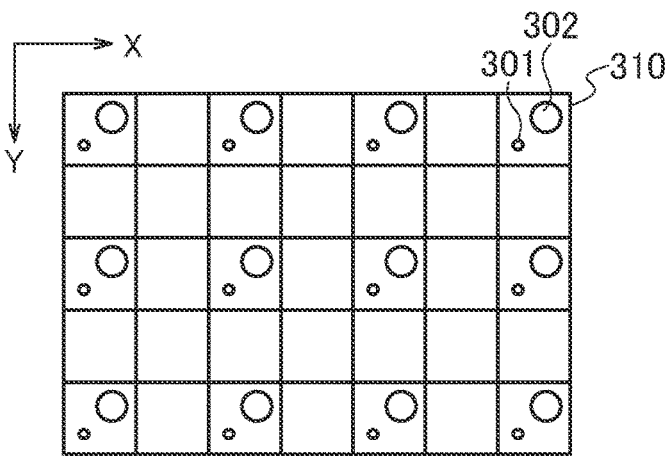
Figure 14:
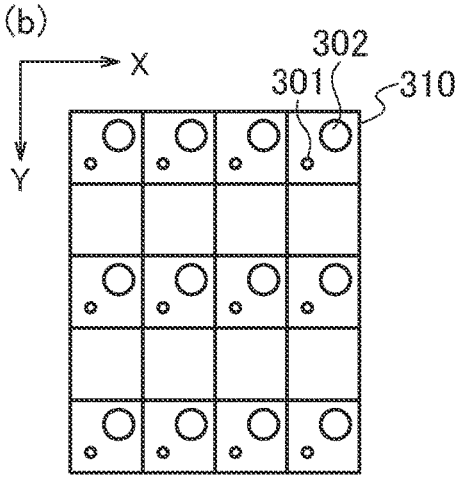
Figure 14:
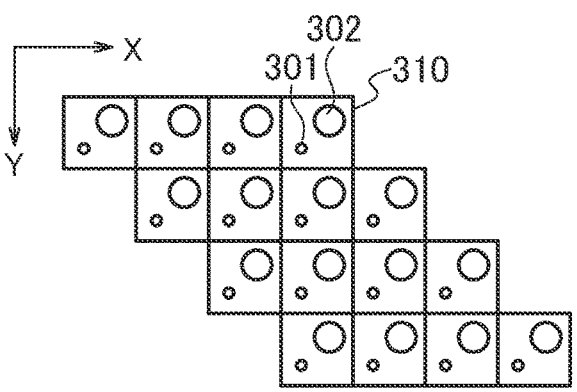
Figure 14:
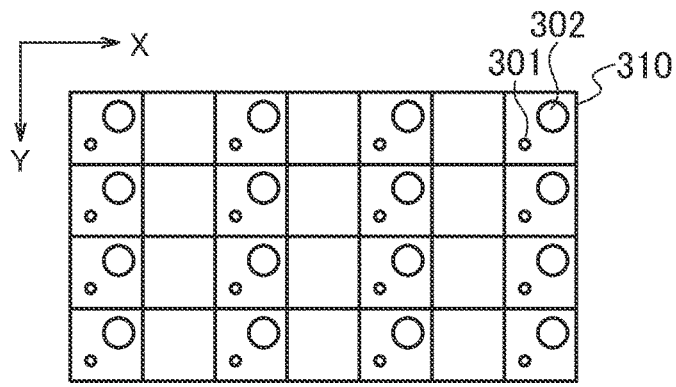

For example, the units 310 are arranged adjacent to each other both in an X direction and a Y direction, as illustrated in FIG. 14(a). The unit 310 may be arranged adjacent to each other only in the X direction but arranged with intervals interposed therebetween in the Y direction, as illustrated in FIG. 14(b). The units 310 may be arranged with intervals interposed therebetween in the X direction and arranged adjacent to each other in the Y direction, as illustrated in FIG. 14(c).

The units 310 may also be arranged with intervals interposed therebetween both in the X direction and the Y direction, as illustrated in FIG. 14(d), or may be arranged diagonally in the planar view, as illustrated in FIG. 14(e).

As described above, the connecting device for inspection according to the embodiment includes the electric contacts 10 and the optical contacts 20 positioned in the probe head 30 with a predetermined positioning accuracy so as to ensure the reliable connection of the respective tip ends. The accurate correspondence of the positional relationship between the electric contacts 10 and the optical contacts 20 to the positional relationship between the respective signal terminals of the optoelectronic devices enables the positioning of the electrical signal terminals of the optoelectronic devices with the electric contacts 10, so as to achieve the accurate positioning of the optical contacts 20 with the optical signal terminals of the optoelectronic devices accordingly. The configuration of the connecting device for inspection thus facilitates the alignment with the optoelectronic devices. In addition, the provision of the electric contact 10 and the optical contact 20 in the same unit 310 enables the electrical measurement and the optical measurement for the optoelectronic device simultaneously.

In the connecting device for inspection, the optical contacts 20 penetrate the probe head 30 and the transformer 40 while being fixed to the probe head 30 but not fixed to the transformer 40. The proximal ends of the electric contacts 10 exposed on the upper surface of the probe head 30 are electrically connected to the tip ends of the connecting wires 41 provided in the lower surface of the transformer 40. This configuration enables the detachable arrangement between the probe head 30 and the transformer 40, and facilitates the maintenance of the connecting device for inspection accordingly.

Other Embodiments

While the present invention has been described above with reference to the embodiment, it should be understood that the present invention is not intended to be limited to the descriptions and the drawings composing part of this disclosure. Various alternative embodiments, examples, and technical applications will be apparent to those skilled in the art according to this disclosure.

While the embodiment has been illustrated above with the case in which the connecting wires 41 provided inside the transformer 40 are part of the distributing wires 70, the transformer 40 used may be a multi-layer wiring substrate such as a multi-layer organic (MLO) substrate or a multi-layer ceramic (MLC) substrate. The use of the wiring substrate as the transformer 40 that uses the connecting wires 41 as a conductive layer can expand the intervals between the respective tip ends on one side of the connecting wires 41 connected to the distributing wires 70 more than the intervals between the respective tip ends on the other side of the connecting wires 41 connected to the proximal ends of the electric contacts 10. This facilitates the expansion of the intervals between the respective distributing wires 70. The wiring substrate, when used as the transformer 40, is provided with the penetration holes through which the optical contacts 20 penetrate in a region in which the connecting wires 41 are not arranged.

The electric contacts 10 used may be spring pins instead of the probes bent inside the probe head 30.

It should be understood that the present invention includes various embodiments not disclosed herein.

The invention claimed is:

1. A connecting device for inspection used for inspecting a semiconductor device including an electrical signal terminal to which an electrical signal is transmitted and an optical signal terminal to which an optical signal is transmitted, the connecting device comprising:
   an electric contact with a tip end electrically connected to the electrical signal terminal;
   an optical contact with a tip end optically connected to the optical signal terminal;
   a probe head configured to hold the electric contact and the optical contact such that the respective tip ends are exposed on a lower surface of the probe head while a proximal end of the electric contact is exposed on an upper surface of the probe head and the optical contact is fixed to the probe head; and
   a transformer including a connecting wire provided therein such that a tip end on one side of the connecting wire electrically connected to the proximal end of the electric contact exposed on the upper surface of the probe head is arranged in a lower surface of the transformer while the optical contact slidably penetrates the transformer,
   wherein a positional relationship between the tip end of the electric contact and the tip end of the optical contact on the lower surface of the probe head corresponds to a positional relationship between the electrical signal terminal and the optical signal terminal of the semiconductor device, and
   the optical contact continuously penetrates the probe head and the transformer.

2. The connecting device for inspection according to claim 1, wherein the probe head has a structure including a plurality of units each arranged such that the tip end of the electric contact and the tip end of the optical contact respectively correspond to the electrical signal terminal and the optical signal terminal of the single semiconductor device.

3. The connecting device for inspection according to claim 1, wherein:

the probe head and the transformer are detachably attached to each other; and the proximal end of the electric contact exposed on the upper surface of the probe head is electrically connected to the tip end on the one side of the connecting wire arranged in the lower surface of the transformer upon an attachment of the transformer and the probe head.

4. The connecting device for inspection according to claim 1, wherein:

the probe head includes a plurality of guide plates arranged separately from each other in a vertical direction through which the electric contact and the optical contact each penetrate; and the optical contact is fixed to a bottom guide plate that is a lowest guide plate among the plural guide plates.

5. The connecting device for inspection according to claim 4, wherein the optical contact is fixed to a guide hole provided in the bottom guide plate with resin.

6. The connecting device for inspection according to claim 4, wherein:

the bottom guide plate is provided with a first guide hole through which the electric contact penetrates;

the first guide hole includes a large-diameter electric guide hole having an inner diameter larger than a diameter of the electric contact and a small-diameter electric guide hole having an inner diameter substantially equal to the diameter of the electric contact, the respective electric guide holes communicating with each other in an extending direction of the first guide hole; and the small-diameter electric guide hole is located closer to the lower surface of the probe head than the large-diameter electric guide hole, and the tip end of the electric contact is inserted to the small-diameter electric guide hole.

7. The connecting device for inspection according to claim 4, wherein:

the bottom guide plate is provided with a second guide hole through which the optical contact penetrates;

the second guide hole includes a large-diameter electric guide hole having an inner diameter larger than a diameter of the optical contact and a small-diameter electric guide hole having an inner diameter substantially equal to the diameter of the optical contact, the respective electric guide holes communicating with each other in an extending direction of the second guide hole; and the small-diameter electric guide hole is located closer to the lower surface of the probe head than the large-diameter electric guide hole, and the tip end of the optical contact is inserted to the small-diameter electric guide hole.

8. The connecting device for inspection according to claim 1, wherein the optical contact is an optical fiber.

9. The connecting device for inspection according to claim 1, further comprising:

a distributing wire coupled with the connecting wire arranged inside the transformer; and a main substrate including an electric terminal electrically connected to the connecting wire via the distributing wire and an optical terminal coupled with the proximal end of the optical contact.

10. The connecting device for inspection according to claim 9, wherein the connecting wire is a part of the distributing wire.

* * * * *